(12) United States Patent
Lee et al.

(10) Patent No.: US 9,761,647 B2
(45) Date of Patent: Sep. 12, 2017

(54) ORGANIC LIGHT EMITTING DISPLAY DEVICE AND METHOD OF MANUFACTURING THE SAME

(71) Applicant: SAMSUNG DISPLAY CO., LTD, Yongin, Gyeonggi-Do (KR)

(72) Inventors: Joo-Hyeon Lee, Yongin (KR); Byoung-Hee Park, Yongin (KR); Jin-Koo Chung, Yongin (KR); Jun-Ho Choi, Yongin (KR); Seong-Min Kim, Yongin (KR)

(73) Assignee: Samsung Display Co., Ltd., Giheung-Gu, Yongin-si, Gyeonggo-Do (KR)

( * ) Notice: Subject to any disclaimer, the term of this patent is extended or adjusted under 35 U.S.C. 154(b) by 0 days.

(21) Appl. No.: 14/981,586

(22) Filed: Dec. 28, 2015

(65) Prior Publication Data

US 2016/0133680 A1 May 12, 2016

Related U.S. Application Data

(63) Continuation of application No. 13/228,997, filed on Sep. 9, 2011, now Pat. No. 9,287,339.

(30) Foreign Application Priority Data

Oct. 28, 2010 (KR) .................. 10-2010-0106022
May 31, 2011 (KR) .................. 10-2011-0052386

(51) Int. Cl.
*H01L 29/18* (2006.01)
*H01L 33/00* (2010.01)
(Continued)

(52) U.S. Cl.
CPC ........ *H01L 27/3262* (2013.01); *H01L 27/326* (2013.01); *H01L 51/5206* (2013.01);
(Continued)

(58) Field of Classification Search
CPC ............. H01L 27/3262; H01L 51/5228; H01L 51/5206; H01L 51/5221; H01L 27/326
See application file for complete search history.

(56) References Cited

U.S. PATENT DOCUMENTS 6,350,996 B1 2/2002 Kawai et al.
6,402,579 B1 6/2002 Pichler et al.
(Continued)

FOREIGN PATENT DOCUMENTS

CN 102456713 B 1/2016
JP 10039757 A 2/1998
(Continued)

OTHER PUBLICATIONS

Taiwanese Office Action issued by the Taiwanese Patent Office on Jan. 5, 2016 in the examination of the Taiwan Patent Application No. 100135464, which corresponds to above U.S. Application. With its English translation.

(Continued)

*Primary Examiner* — Stephen W Smoot
*Assistant Examiner* — Vicki B Booker
(74) *Attorney, Agent, or Firm* — Robert E. Bushnell, Esq.

(57) ABSTRACT

An organic light emitting display and a method of manufacturing the same. The organic light-emitting display is a transparent display where one can see through the display to view an image on the other side of the display. Each pixel of the display has a first region that includes an organic light emitting diode and a thin film transistor, and a larger second region that is transparent. The second region is made of either transparent layers or ultra-thin layers so that light is not blocked. A second electrode of the display may include magnesium and may be produced by a selective deposition process, so that use of a fine metal mask may be avoided.

20 Claims, 6 Drawing Sheets

(51) Int. Cl.
  *H01L 27/32* (2006.01)
  *H01L 27/12* (2006.01)
  *H01L 51/52* (2006.01)
(52) U.S. Cl.
  CPC ...... *H01L 51/5221* (2013.01); *H01L 51/5228* (2013.01); *H01L 27/1225* (2013.01); *H01L 51/5234* (2013.01); *H01L 2227/323* (2013.01); *H01L 2251/301* (2013.01); *H01L 2251/5323* (2013.01); *H01L 2251/558* (2013.01)

(56) References Cited

U.S. PATENT DOCUMENTS

| | | |
|---|---|---|
| 7,323,411 B1 | 1/2008 | Blosse |
| 7,402,517 B2 | 7/2008 | Yonker et al. |
| 2002/0121699 A1 | 9/2002 | Cheng et al. |
| 2003/0234608 A1 | 12/2003 | Lee et al. |
| 2004/0113544 A1 | 6/2004 | Murakami et al. |
| 2005/0116341 A1 | 6/2005 | Farrar |
| 2007/0141259 A1 | 6/2007 | House et al. |
| 2009/0261713 A1 | 10/2009 | Choi et al. |
| 2011/0175097 A1 | 7/2011 | Song et al. |
| 2011/0220922 A1 | 9/2011 | Kim et al. |

FOREIGN PATENT DOCUMENTS

| | | |
|---|---|---|
| JP | 2008-112112 A | 5/2008 |
| KR | 10-2004-0000630 A | 1/2004 |
| KR | 1020040078304 A | 9/2004 |
| KR | 10-2010-0043943 A | 4/2010 |
| KR | 10-2011-0085780 A | 7/2011 |
| KR | 10-2011-0103735 A | 9/2011 |

OTHER PUBLICATIONS

Korean Office Action issued on Oct. 23, 2013 in connection with Korean Patent Application No. 10-2011-0052386 Cited in IDS filed on Dec. 6, 2013 for U.S. Appl. No. 13/228,997.

ORGANIC LIGHT EMITTING DISPLAY DEVICE AND METHOD OF MANUFACTURING THE SAME

CLAIM OF PRIORITY

This application is Continuation of U.S. patent application Ser. No. 13/228,997 filed on 9 Sep. 2011, now U.S. Pat. No. 9,287,339 issued on the 15th of Mar. 2016, which claims priority and all the benefits of Korean Patent Application No. 10-2010-0106022 earlier filed on 28th of Oct. 2010 and of Korean Patent Application No. 10-2011-0052386 earlier filed on 31st May 2011 in the Korean Intellectual Property Office (KIPO), the entire contents of all which are incorporated herein by reference.

BACKGROUND OF THE INVENTION

Field of the Invention

The present invention relates to an organic light emitting display device and a method of manufacturing the same, and more particularly, to a transparent organic light emitting display device and a method of manufacturing the same.

Description of the Related Art

An organic light emitting display device is widely used in personal portable devices including MPEG-1 Audio Layer-3 (MP3) players and mobile phones, televisions (TVs), and the like due to its wide viewing angle, high contrast, fast response speed, and low power consumption. In this regard, in order to make the organic light emitting display device look transparent, there is an attempt to form a transmittance portion except for a region whereon a thin film transistor or an organic electroluminescent device (organic EL) is located. In this case, when a cathode is deposited, a fine metal mask is used so that patterning is performed so that the cathode that is made out of an opaque metal is not formed in the transmittance portion.

However, due to a process in which cathodes are deposited while the fine metal mask is moved several times, a position error with respect to formation of the transmittance portion occurs, and a shape of the transmittance portion is deformed.

SUMMARY OF THE INVENTION

The present invention provides a transparent organic light emitting display device having high transmittance with respect to external light and a method of manufacturing the transparent organic light emitting display device.

The present invention also provides an organic light emitting display device in which a cathode is easily patterned and a method of manufacturing the organic light emitting display device.

According to an aspect of the present invention, there is provided an organic light emitting display device including a substrate, a plurality of pixels arranged on the substrate, each pixel includes a first region that emits light and a second region that transmits external light, the first region including a pixel circuit unit including at least one thin film transistor and a first electrode electrically connected to the pixel circuit unit and patterned to have an island form, the first electrode of each pixel being separate in each of the plurality of pixels, wherein each pixel further includes a first organic layer arranged to cover the first electrode, a plurality of second organic layers arranged on the first organic layer, patterned to correspond to the first organic layer, and comprising an emission layer (EML), a third organic layer arranged on the second organic layers to cover the second organic layers, a first auxiliary layer arranged on the third organic layer, and comprising a first portion patterned to correspond to the first electrode and a second electrode patterned on the first auxiliary layer to correspond to the first portion.

The first auxiliary layer may include a second portion arranged within the second region that is connected to the first portion. The organic light emitting display device may also include a second auxiliary layer arranged on the first auxiliary layer and patterned to correspond to the second portion of the first auxiliary layer. Here, the second electrode may be further disposed on the second auxiliary layer, and the second electrode disposed on the second auxiliary layer may have a smaller thickness than the second electrode patterned to correspond to the first portion of the first auxiliary layer.

The third organic layer may be further arranged within the second region. The first organic layer may be further arranged within the second region. The first auxiliary layer may include a second portion that is connected to the first portion and is arranged on the first organic layer within the second region. The organic light emitting display device may also include a second auxiliary layer patterned on the first auxiliary layer to correspond to the second portion of the first auxiliary layer. The first organic layer may include a hole transport layer (HTL) or a hole injection layer (HIL). The third organic layer may include an electron injection layer (EIL) or an electron transport layer (ETL). The first electrode may overlap the pixel circuit unit. The first region of each of the plurality of pixels may include a circuit part and an emission part, wherein the pixel circuit unit is arranged within the circuit part, and wherein the first electrode may be arranged within the emission part. The circuit part and the emission part of each of the plurality of pixels may be adjacent to each other. The organic light emitting display device may also include an insulating layer covering ends of the first electrode, and arranged between the first organic layer and the ends of the first electrode. The second electrode may include magnesium (Mg). The second electrode may be further deposited on the second portion, and the second electrode deposited on the second portion may have a smaller thickness than the second electrode patterned to correspond to the first portion of the first auxiliary layer.

According to another aspect of the present invention, there is provided a method of manufacturing an organic light emitting display device, the method including partitioning a substrate into a plurality of pixels having first regions that emit light and second regions that transmit external light, respectively, forming a plurality of pixel circuit units that are arranged within the first regions of the plurality of pixels, respectively, and that includes one or more thin film transistors, respectively, forming a plurality of first electrodes respectively arranged within the first regions of the plurality of pixels, electrically connected to the plurality of pixel circuit units, respectively, and patterned to have an island form that is separate in each of the plurality of pixels, forming a first organic layer to cover the first electrode, forming a plurality of second organic layers on the first organic layer, the plurality of second organic layers being patterned to correspond to the first organic layer and comprise an emission layer (EML), forming a third organic layer on the second organic layers to cover the second organic layers, forming a first auxiliary layer on the third organic layer, the first auxiliary layer including a first portion that is patterned to correspond to the first electrode and forming a second electrode by depositing a metal in the first region and in the second region, the second electrode being patterned on the first auxiliary layer to correspond to the first portion.

The forming of the first auxiliary layer may also include forming a second portion arranged within the second region and being connected to the first portion. The method may also include forming a second auxiliary layer between the forming of the first auxiliary layer and the forming of the second electrode, wherein the second auxiliary layer may be patterned on the first auxiliary layer to correspond to the second portion of the first auxiliary layer. The third organic layer may be arranged within both the first region and the second region. The first organic layer may be arranged within both the first region and the second region. The first auxiliary layer may also include a second portion arranged on the first organic layer within the second region and being connected to the first portion. The method may also include forming a second auxiliary layer between the forming of the first auxiliary layer and the forming of the second electrode, wherein the second auxiliary layer is patterned on the first auxiliary layer to correspond to the second portion of the first auxiliary layer. The metal may include magnesium (Mg). The first organic layer may include a hole transport layer (HTL) or a hole injection layer (HIL). The third organic layer may include an electron injection layer (EIL) or an electron transport layer (ETL). The first electrode may overlap the pixel circuit unit. The first region of each of the plurality of pixels may include a circuit part and an emission part, the pixel circuit unit being arranged in the circuit part, the first electrode being arranged within the emission part. The circuit part and the emission part of each of the plurality of pixels may be adjacent to each other. The method may also include forming an insulating layer between the forming of the first electrode and the forming of the first organic layer, wherein the insulating layer covers ends of the first electrode and may be arranged between the first organic layer and the ends of the first electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention will be described in detail by explaining exemplary embodiments of the invention with reference to the attached drawings. Throughout the specification, a term "and/or" includes at least one from among all listed components and one or more combinations of all listed components.

Figure 1:
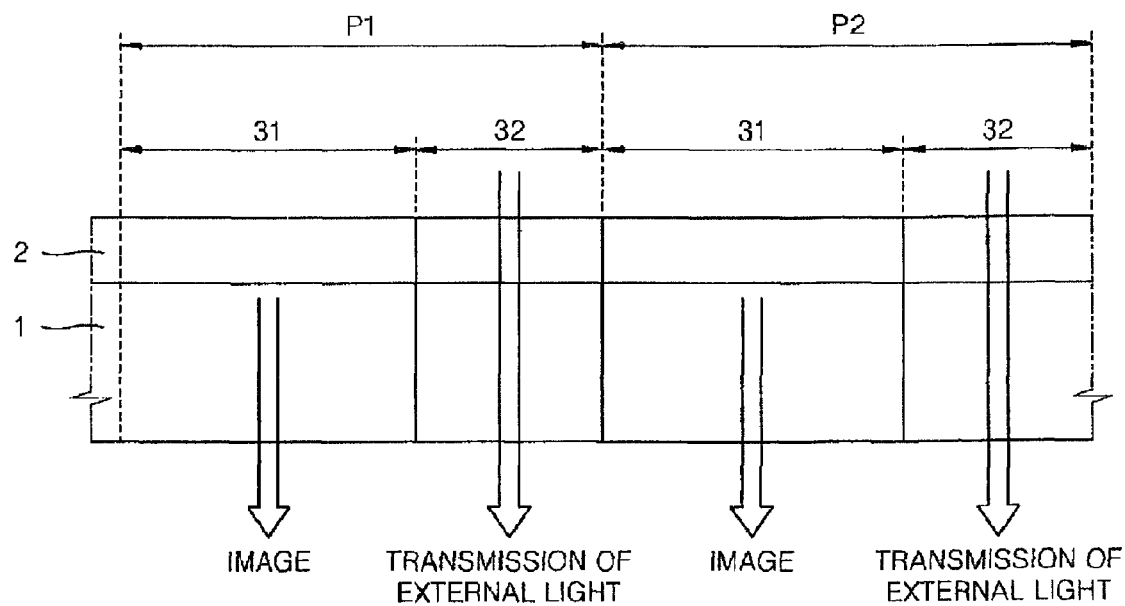
FIG. 1 illustrates a first pixel and a second pixel which are two neighboring pixels of an organic light emitting display device according to an embodiment of the present invention.

Turning now to FIG. 1, FIG. 1 illustrates a first pixel P1 and a second pixel P2, which are two neighboring pixels of an organic light emitting display device. FIG. 1 also shows a cross-sectional view of the organic light emitting display device. Referring to FIG. 1, the organic light emitting display device has a structure in which a display unit 2 is arranged on a substrate 1. In the organic light emitting display device, external light is incident by passing through the substrate 1 and the display unit 2.

As will be described later, the display unit 2 is formed to be transparent with respect to external light, so that, in FIG. 1, a user positioned at a side to which an image is realized may view another image below a bottom of the substrate 1. Although the organic light emitting display device shown in FIG. 1 is a bottom emission type organic light emitting display device in which an image of the display unit 2 is realized through the substrate 1, a type of the organic light emitting display device is not limited thereto, and thus the organic light emitting display device may be a top emission type organic light emitting display device in which an image of the display unit 2 is realized away from the substrate 1.

Referring to FIG. 1, each of the first and second pixels P1 and P2 includes a first region 31 and a second region 32. An image is realized from the display unit 2 in the first region 31, and external light is transmitted through the second region 32. That is, in the organic light emitting display device according to the present embodiment, each of the first and second pixels P1 and P2 includes the first region 31 for realizing an image and the second region 32 for transmitting external light, so that when a user does not view an image, the user may view an external image.

In this regard, devices including a thin film transistor, a capacitor, an organic electroluminescent device (organic EL) or the like are not formed in the second region 32, so that it is possible to maximize external light transmittance, and to minimize distortion of a transmitted external image which may occur due to interference by the devices including the thin film transistor, the capacitor, the organic EL or the like.

Figure 2:
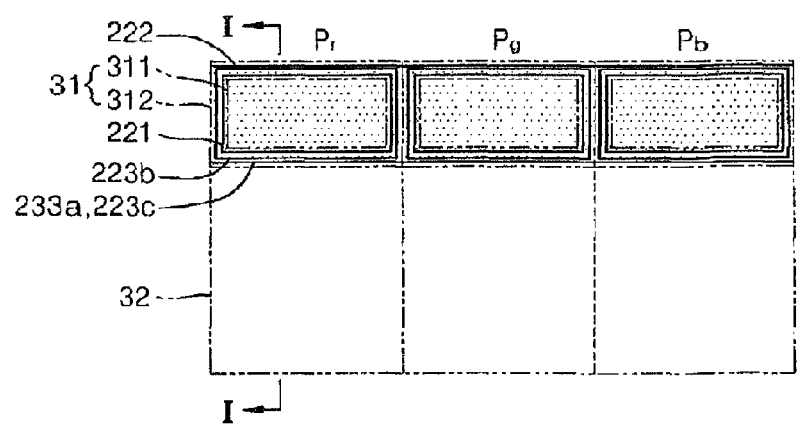
FIG. 2 is a plane view of a red pixel, a green pixel, and a blue pixel which are adjacent to each other in the organic light emitting display device.
Figure 3:
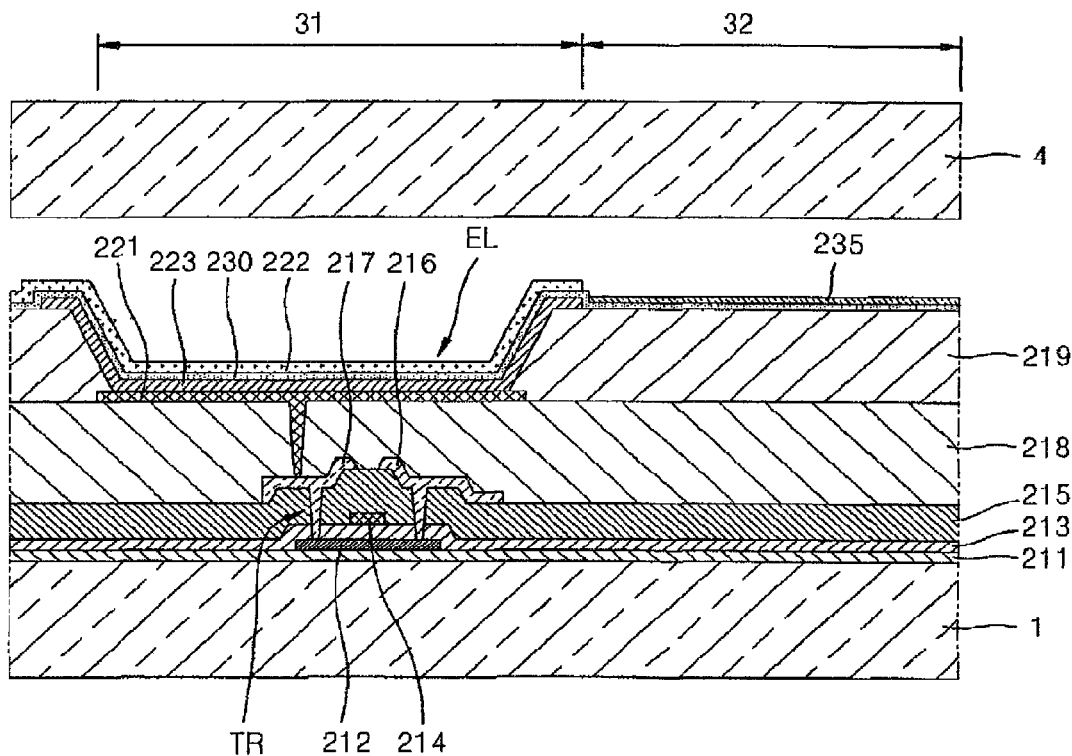
FIG. 3 is a cross-sectional view of the red pixel, taken along a line I-I of FIG. 2.
Figure 4:
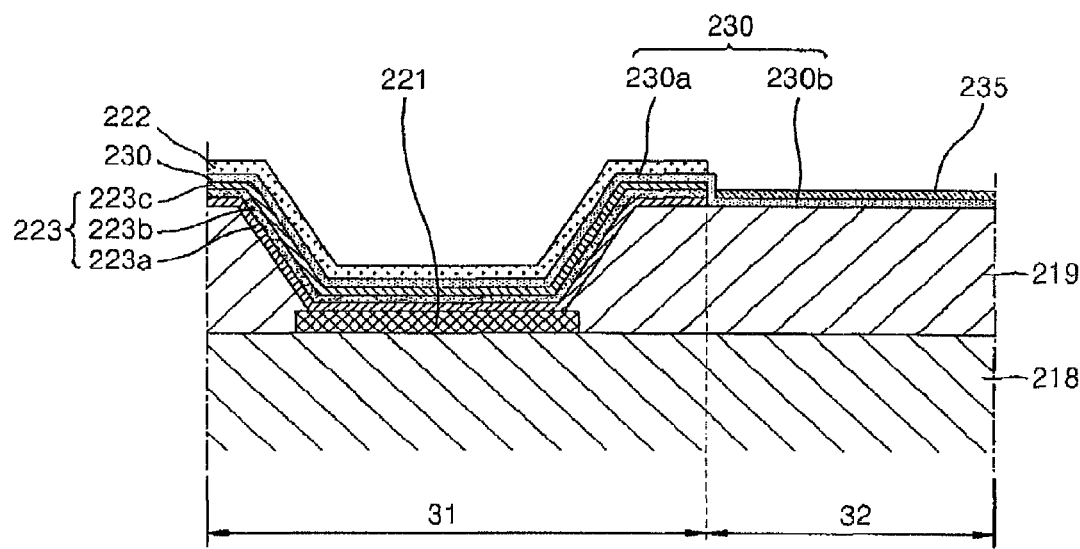
FIG. 4 is a cross-sectional view for describing in detail an organic electroluminescent device (organic EL) of FIG. 3 according to another embodiment of the present invention.

Turning now to FIGS. 2 through 4, FIG. 2 is a plane view of a red pixel Pr, a green pixel Pg, and a blue pixel Pb which are adjacent to each other, FIG. 3 is a cross-sectional view of the red pixel Pr taken along a line I-I of FIG. 2 and FIG. 4 is a cross-sectional view for describing in detail an organic EL of FIG. 3 according to another embodiment of the present invention.

Referring to FIG. 2, each of the red, green, and blue pixels Pr, Pg, and Pb includes a circuit part 311 and an emission part 312 in a first region 31. In the present embodiment, the circuit part 311 and the emission part 312 are disposed to overlap each other.

A second region 32 that is transparent to external light is disposed to be adjacent to the first region 31. The second region 32 may be separate for each of the red, green, and blue pixels Pr, Pg, and Pb, but, although not illustrated, the second region 32 may be arranged while extending over the red, green, and blue pixels Pr, Pg, and Pb. In a case where the second region 32 is arranged while extending over the red, green, and blue pixels Pr, Pg, and Pb, an area of the second region 32 transmitting external light increases so that transmittance of an entire display unit 2 may be increased.

As illustrated in FIG. 3, a pixel circuit unit including a thin film transistor TR is arranged within the circuit part 311. Referring to FIG. 3, the pixel circuit unit includes one thin film transistor TR, but a structure of the pixel circuit unit is not limited thereto. The pixel circuit unit may further include a plurality of thin film transistors as well as the one thin film transistor TR, and storage capacitors, and the pixel circuit unit may also include lines such as scan lines, data lines or Vdd lines which are connected to the thin film transistors and the storage capacitors.

An organic EL that is a light emitting device is disposed within the emission part 312. The organic EL is electrically connected to the thin film transistor TR of the pixel circuit unit 311.

A buffer layer 211 is formed on the substrate 1, and the pixel circuit unit including the thin film transistor TR is formed on the buffer layer 211. The buffer layer 211 is made out of a transparent insulating material, serves to planarize a surface by preventing penetration of foreign substances, and may be made out of one of various materials capable of performing the function. For example, the buffer layer 211 may be made out of an inorganic material including silicon oxide, silicon nitride, silicon oxynitride, aluminum oxide, aluminum nitride, titanium oxide or titanium nitride, an organic material including polyimide, polyester or acryl, or a multi-stack including the inorganic material and the organic material. The buffer layer 211 is not an essential configuring element, and thus may be omitted if necessary.

A semiconductor active layer 212 is formed on the buffer layer 211. The semiconductor active layer 212 may be made out of polycrystalline silicon but is not limited thereto, and thus may instead be made out of an oxide semiconductor. For example, the semiconductor active layer 212 may be made out of a G-I—Z—O layer [$(In_2O_3)_a(Ga_2O_3)_b(ZnO)_c$ layer] (where a, b, c are actual numbers that satisfy a≥0, b>0, c>0, respectively). In a case where the semiconductor active layer 212 is made out of the oxide semiconductor, light transmittance in the circuit part 311 of the first region 31 may be further improved so that external light transmittance of the entire display unit 2 may be increased.

A gate insulating layer 213 is formed on the buffer layer 211 to cover the semiconductor active layer 212, and a gate electrode 214 is formed on the gate insulating layer 213. An interlayer insulating layer 215 is formed on the gate insulating layer 213 to cover the gate electrode 214, and a source electrode 216 and a drain electrode 217 are formed on the interlayer insulating layer 215, and then respectively contact the semiconductor active layer 212 via contact holes. It is to be understood that a structure of the thin film transistor TR is not limited to the aforementioned structure, and thus may vary.

A passivation layer 218 is formed to cover the thin film transistor TR. The passivation layer 218 may be a single or multi-layered insulating layer whose top surface is planarized. The passivation layer 218 may be made out of an inorganic material and/or an organic material.

As illustrated in FIG. 3, a first electrode 221 of the organic EL, which is electrically connected to the thin film transistor TR, is formed on the passivation layer 218. The first electrode 221 has an island form that is separate in each pixel. The first electrode 221 may be made out of a material having a high work function, such as indium tin oxide (ITO), indium zinc oxide (IZO), ZnO, or $In_2O_3$.

In a case where the organic light emitting display device of FIG. 1 is a top emission type organic light emitting display device in which an image is realized away from the substrate 1, the first electrode 221 may further include a reflective layer made out of silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). If the first electrode 221 is a reflective electrode, a conductive pattern of the pixel circuit unit may be covered by the first electrode 221 so that it is possible to reduce transmitted image distortion that occurs due to that external light being scattered by the conductive pattern of the pixel circuit unit.

An insulating layer 219 is formed on the passivation layer 218. The insulating layer 219 functions as a pixel defining layer. The insulating layer 219 covers ends of the first electrode 221, and exposes a center portion of the first electrode 221. The insulating layer 219 may cover the second region 32, and it is not necessary for the insulating layer 219 to entirely cover the first region 31, but it is necessary for the insulating layer 219 to cover at least a portion of the first region 31, in particular, the ends of the first electrode 221. The insulating layer 219 may be made out of an organic insulating material such as a polymer-based organic material including an acryl-based resin, an epoxy-based resin, polyimide or the like, and an upper surface of the insulating layer 219 may be planarized.

An organic layer 223 is formed on the exposed center portion of the first electrode 221 and on a portion of the insulating layer 219 that covers the ends of the first electrode 221. As illustrated in FIG. 4, the organic layer 223 includes a first organic layer 223a, a second organic layer 223b, and a third organic layer 223c. The first organic layer 223a includes a hole injection layer (HIL) and a hole transport layer (HTL). The second organic layer 223b includes an emission layer (EML). The third organic layer 223c includes an electron injection layer (EIL) and an electron transport layer (ETL). The first organic layer 223a and the third organic layer 223c are a common layer and thus may be commonly applied to all pixels, but the second organic layer 223b is separately deposited according to a color of each pixel.

The HIL may be made out of a phthalocyanine compound including copper phthalocyanine, or TCTA, m-MTDATA, m-MTDAPB, or the like, which are a starburst-type amine. The HTL may be made out of N,N'-bis(3-methylphenyl)-N, N'-diphenyl-[1,1-biphenyl]-4,4'-diamine (TPD), N,N'-di (naphthalene-1-yl)-N,N'-diphenyl benzidine (a-NPD), or the like. The EIL may be made out of lithium fluoride (LiF), sodium chloride (NaCl), caesium fluoride (CsF), lithium oxide ($Li_2O$), barium oxide (BaO), or Liq. The ETL may be made out of aluminum tris(8-hydroxyquinoline) (Alq3).

The EML may include a host material and a dopant material. Examples of the host material may include tris(8-hydroxy-quinolinato)aluminum (Alq3), 9, 10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl(DPVBi), 4,4'-bis(2,2-diphenyl-ethene-1-yl)-4,4'-dimethylphenyl(p-DMDPVBi), tert(9,9-diarylfluorene)s(TDAF), 2-(9,9'-spirobifluorene-2-yl)-9,9'-spirobifluorene (BSDF), 2,7-bis(9,9*-spirobifluorene-2-yl)-9,9'-spirobifluorene (TSDF), bis(9,9-diarylfluorene)s(BDAF), 4,4'-bis(2,2-diphenyl-ethene-1-yl)-4,4'-di-(tert-butyl)phenyl(p-TDPVBi), 1,3-bis(carbazol-9-yl)benzene (mCP), 1,3,5-tris(carbazol-9-yl)benzene (tCP), 4,4',4''-tris(carbazol-9-yl)triphenylamine (TcTa), 4,4'-bis(carbazol-9-yl)biphenyl(CBP), 4,4'-bis(9-carbazolyl)-2,2'-dimethyl-biphenyl(CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), or the like. Examples of the dopant material may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), or the like.

Referring now to FIG. 4, a first auxiliary layer 230 is formed on the insulating layer 219 and on the organic layer 223. The first auxiliary layer 230 may be formed to completely cover the first and second regions 31 and 32. In more detail, the first auxiliary layer 230 may include a first portion 230*a* and a second portion 230*b*. Here, the first portion 230*a* is arranged in the first region 31 corresponding to the first electrode 221 and the second portion 230*b* is connected to the first portion 230*a* while being arranged in the second region 32. As illustrated in FIG. 4, the second portion 230*b* of the first auxiliary layer 230 is formed on the insulating layer 219 of the second region 32 in which the organic layer 223 is not formed.

The first auxiliary layer 230 may include at least one material selected from the group consisting of Al, Ag, and an alloy of Mg and Ag. A thickness of the first auxiliary layer 230 may be formed to the extent that the thickness does not decrease transmittance of the second region 32. The thickness of the first auxiliary layer 230 may be between about 5 Å and about 100 Å, and preferably between about 10 Å and about 20 Å.

In a test where the first auxiliary layer 230 is made out of Mg and Ag at a mass ratio of 9:1 and has a thickness of about 10 Å, transmittance reaches 99.3%. In a test where the first auxiliary layer 230 is made out of Al and has a thickness of about 10 Å, transmittance reaches 99.8%. According to the test results, it is possible to understand that, although the first auxiliary layer 230 is present in second region 32, the first auxiliary layer 230 does not significantly harm a performance of the second region 32 functioning to transmit external light. Functions of the first auxiliary layer 230 will be described later.

A second auxiliary layer 235 is formed on the first auxiliary layer 230. The second auxiliary layer 235 corresponds to the second portion 230*b* of the first auxiliary layer 230. The second auxiliary layer 235 may be made out of 8-Quinolinolato Lithium (Liq), N,N-diphenyl-N,N-bis(9-phenyl-9H-carbazol-3-yl)biphenyl-4,4'-diamine (HT01), N(diphenyl-4-yl) 9,9-dimethyl-N-(4(9-phenyl-9H-carbazol-3-yl)phenyl)-9H-fluorene-2-amine (HT211), 2-(4-(9,10-di(naphthalene-2-yl)anthracene-2-yl)phenyl)-1-phenyl-1H-benzo-[D]imidazole (LG201), or the like. A thickness of the second auxiliary layer 235 may be formed to the extent that the thickness does not decrease transmittance of the second region 32. Functions of the second auxiliary layer 235 will be described later.

A second electrode 222 is formed to correspond to the first portion 230*a* of the first auxiliary layer 230. The second electrode 222 is barely formed on the second auxiliary layer 235. The second electrode 222 may be made out of metal having a low work function. The second electrode 222 may include Ag, Mg, Al, Pt, Pd, Au, Ni, Nd, Ir, Cr, Li, or Ca, in particular, a metal including Mg or an Mg alloy. The first electrode 221 may function as an anode, and the second electrode 222 may function as a cathode. Obviously, polarities of the first electrode 221 and the second electrode 222 may instead be reversed. Finally, an encapsulation substrate 4 covers the resultant structure to keep out moisture and oxygen to complete the display structure. The second electrode 222 may be manufactured by performing a general vacuum deposition process. For example, the second electrode 222 may be a thin film formed by depositing magnesium in a vacuum chamber by performing a thermal evaporation method or a sputtering method.

In the present embodiment of FIG. 4, the first organic layer 223*a* and the third organic layer 223*c* are deposited as a common layer to all pixels in the first region 31 corresponding to the first electrode 221, by using a fine metal mask for patterning. The second organic layer 223*b* is patterned to correspond to each pixel, that is, the second organic layer 223*b* is patterned to correspond to the first electrode 221 by using another fine metal mask. Also, the first auxiliary layer 230 is completely deposited on the third organic layer 223*c* and the insulating layer 219 by using an open mask, without distinguishing between the first region 31 and the second region 32. Afterward, by using a fine metal mask for patterning, the second auxiliary layer 235 is deposited as a common layer to all pixels on the insulating layer 219 of the second region 32 in which the organic layer 223 is not formed. Here, unlike the fine metal mask, an open mask indicates a mask having a wide open opening without a fine pattern.

The second electrode 222 is deposited by using an open mask, and at this time, due to the first auxiliary layer 230 and the second auxiliary layer 235, the second electrode 222 may be deposited on all pixels in the first region 31 only, without using a fine metal mask for patterning according to the related art.

Metal, in particular, metal including Mg or an Mg alloy for forming the second electrode 222 is easily deposited on the first auxiliary layer 230 but is barely deposited on the second auxiliary layer 235. The first auxiliary layer 230 has good adhesion to the second electrode 222 that is made out of at least one metal material selected from the group consisting of Al, Ag, and an alloy of Mg and Ag. However, the second auxiliary layer 235 has bad adhesion to the second electrode 222 when the second electrode 222 is made out of Mg or metal including an Mg alloy. Thus, when the second electrode 222 is deposited by using metal including Mg or an Mg alloy, although deposition is performed on all pixels in the first region 31 and the second region 32 by using the metal and an open mask, the metal is only deposited in the first region 31 in which the first auxiliary layer 230 is formed, and the metal is barely deposited in the second region 32 in which the second auxiliary layer 235 is formed, so that a patterning effect with respect to the second electrode 222 is automatically obtained.

Meanwhile, in a case where a fine metal mask is used to form the patterned second electrode 222, as in a case of the organic layer 223, the fine metal mask may become deformed when it is used for a long time, due to high deposition temperature, so that unstable factors including a shadow effect may be incurred in a process. In this regard, according to the present embodiment, the second electrode 222 is formed only in the first region 31 in which the first auxiliary layer 230 is exposed, without using the fine metal mask, and by using a relation between materials for forming the second electrode 222 and the first and second auxiliary layer 230, 235, so that all of the aforementioned problems may be solved.

Figure 5:
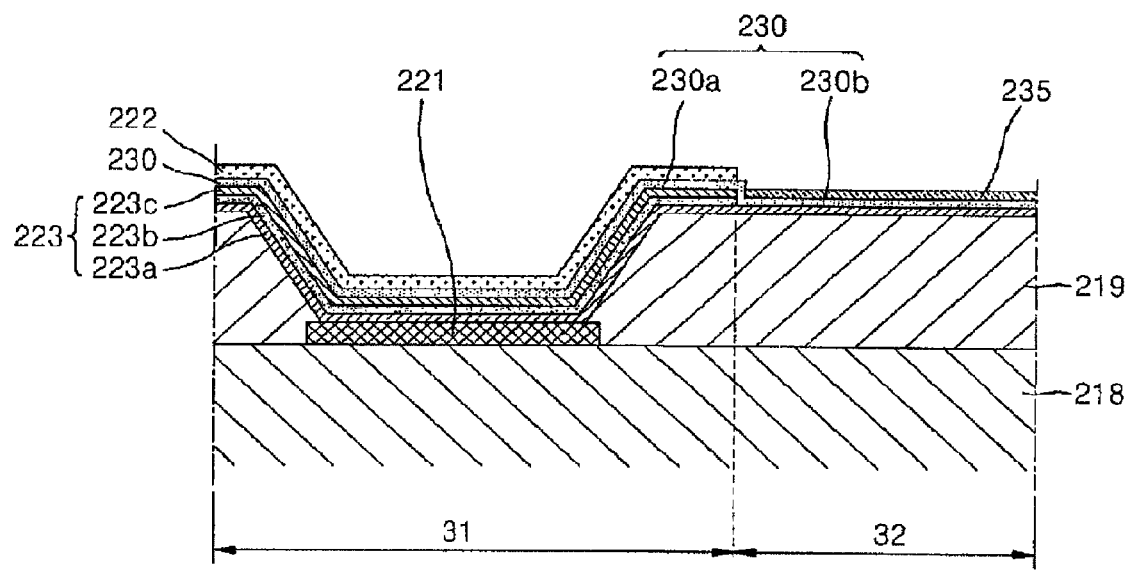
FIG. 5 is a cross-sectional view for describing in detail another example of the organic EL of FIG. 3 according to another embodiment of the present invention.

Turning now to FIG. 5, FIG. 5 is a cross-sectional view for describing in detail another example of the organic EL of FIG. 3 according to another embodiment of the present invention. Referring to FIG. 5, the present embodiment is similar to the previous embodiment of FIG. 4 in that a first organic layer 223a, a second organic layer 223b, a third organic layer 223c, a first auxiliary layer 230, and a second electrode 222 are sequentially formed on a first electrode 221. In addition, the present embodiment is also similar to the previous embodiment of FIG. 4 in that a first auxiliary layer 230 and a second auxiliary layer 235 are formed in a second region 32. However, the present embodiment is different from the previous embodiment of FIG. 4 in that the first organic layer 223a of the present embodiment extends over into the second region 32. Thus, the present embodiment is characterized in that the first organic layer 223a, the first auxiliary layer 230, and the second auxiliary layer 235 are sequentially stacked in the second region 32.

The present embodiment of FIG. 5 is advantageous in that it is not necessary to separately perform patterning on the first organic layer 223a. Except for this feature, configuring elements corresponding to those described with reference to FIG. 4 perform equivalent or similar functions, thus, detailed descriptions thereof are omitted here.

Figure 6:
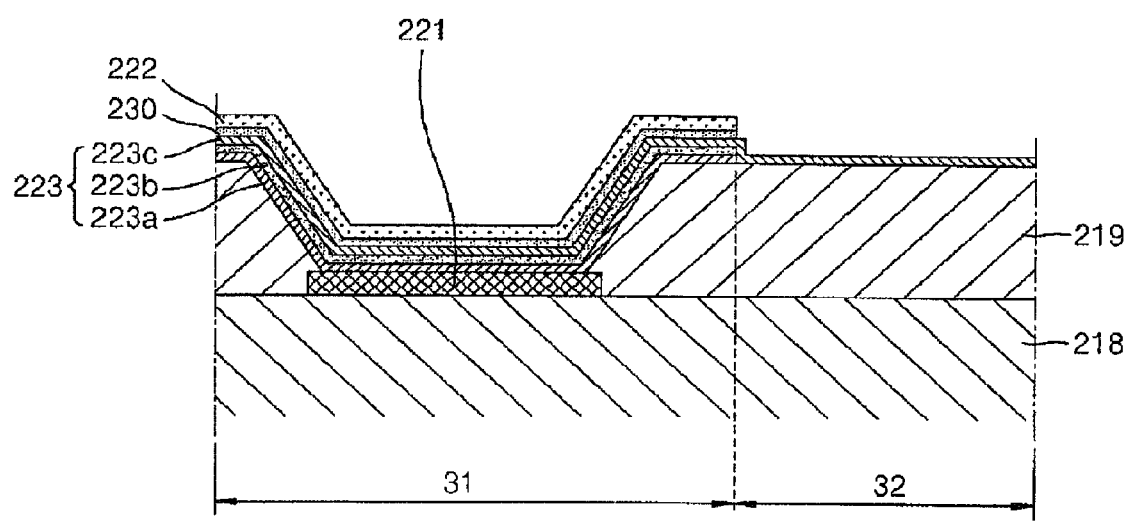
FIG. 6 is a cross-sectional view for describing in detail another example of the organic EL of FIG. 3 according to another embodiment of the present invention.

Referring now to FIG. 6, FIG. 6 is a cross-sectional view for describing in detail another example of the organic EL of FIG. 3 according to another embodiment of the present invention. Referring to FIG. 6, the present embodiment is similar to the previous embodiment of FIG. 4 in that a first organic layer 223a, a second organic layer 223b, a third organic layer 223c, a first auxiliary layer 230, and a second electrode 222 are sequentially formed on a first electrode 221. However, the present embodiment is different in that the first auxiliary layer 230 and a second auxiliary layer 235 are not formed in a second region 32 but instead, the third organic layer 223c extends over the second region 32. In the present embodiment, configuring elements corresponding to those described with reference to FIG. 4 perform equivalent or similar functions, thus, detailed descriptions thereof are omitted here.

Referring to FIG. 6, the present embodiment is characterized in that the third organic layer 223c is arranged in all of a first region 31 and the second region 32. Here, the third organic layer 223c includes a material on which metal, in particular, Mg or an Mg alloy for forming the second electrode 222 is barely deposited. In more detail, the third organic layer 223c may include 8-Quinolinolato Lithium (Liq), 2-(4-(9,10-di(naphthalene-2-yl)anthracene-2-yl)phenyl)-1-phenyl-1H-benzo-[D]imidazole (LG201), or the like.

The first auxiliary layer 230 is formed on a portion of a surface of the third organic layer 223c. In more detail, the first auxiliary layer 230 is formed on the third organic layer 223c by being patterned so as to correspond to the first electrode 221. As described above, the first auxiliary layer 230 includes a material on which metal, in particular, Mg or an Mg alloy for forming the second electrode 222, is easily deposited.

Figure 7:
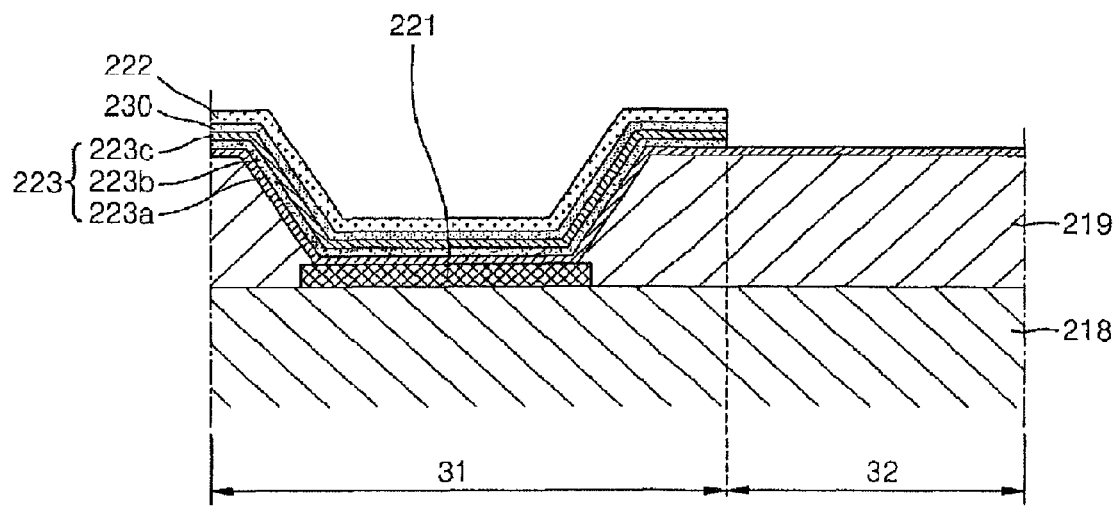
FIG. 7 is a cross-sectional view for describing in detail another example of the organic EL of FIG. 3 according to another embodiment of the present invention.

Turning now to FIG. 7, FIG. 7 is a cross-sectional view for describing in detail another example of the organic EL of FIG. 3 according to another embodiment of the present invention. Referring to FIG. 7, the present embodiment is similar to the previous embodiment of FIG. 4 in that a first organic layer 223a, a second organic layer 223b, a third organic layer 223c, a first auxiliary layer 230, and a second electrode 222 are sequentially formed on a first electrode 221. However, the present embodiment is different in that the first auxiliary layer 230 and a second auxiliary layer 235 are not formed in a second region 32 but instead, the first organic layer 223a extends over the second region 32. In the present embodiment, configuring elements corresponding to those described with reference to FIG. 4 perform equivalent or similar functions, thus, detailed descriptions thereof are omitted here.

Referring to FIG. 7, the present embodiment is characterized in that the first organic layer 223a is arranged in all of a first region 31 and the second region 32. Here, the first organic layer 223a includes a material on which metal, in particular, Mg or an Mg alloy for forming the second electrode 222 is barely deposited. In more detail, the first organic layer 223a may include N,N-diphenyl-N,N-bis(9-phenyl-9H-carbazol-3-yl)biphenyl-4,4'-diamine (HT01), N(diphenyl-4-yl) 9,9-dimethyl-N-(4(9-phenyl-9H-carbazol-3-yl)phenyl)-9H-fluorene-2-amine (HT211), or the like.

The first auxiliary layer 230 is formed on a portion of a surface of the first organic layer 223a. In more detail, the first auxiliary layer 230 is formed on the first organic layer 223a by being patterned so as to correspond to the first electrode 221. As described above, the first auxiliary layer 230 includes a material on which metal, in particular, Mg or an Mg alloy for forming the second electrode 222, is easily deposited.

Thus, according to the embodiments of FIGS. 6 and 7, when the second electrode 222 is deposited by using metal including Mg or an Mg alloy, although deposition is performed on all pixels in the first region 31 and the second region 32 by using the metal and an open mask, a metal layer forms mostly on the first auxiliary layer 230, and the metal barely adhere to and thus barely form on a surface of the first organic layer 223a or a surface of the third organic layer 223c, which is exposed in the second region 32, so that a patterning effect with respect to the second electrode 222 is automatically obtained without the use of a fine metal mask.

Figure 8:
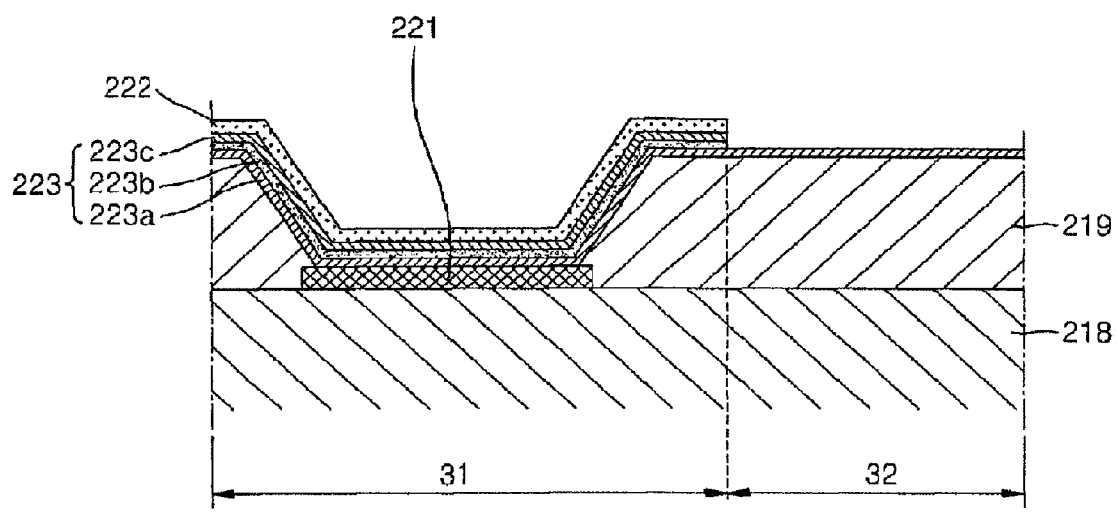
FIG. 8 is a cross-sectional view for describing in detail another example of the organic EL of FIG. 3 according to another embodiment of the present invention.

Turning now to FIG. 8, FIG. 8 is a cross-sectional view for describing in detail another example of the organic EL of FIG. 3 according to another embodiment of the present invention. Referring to FIG. 8, a first organic layer 223a, a second organic layer 223b, a third organic layer 223c, and a second electrode 222 are sequentially formed on a first electrode 221. Unlike the embodiment of FIG. 4, the present embodiment has a structure in which a first auxiliary layer 230 and a second auxiliary layer 235 are not formed, and similar to the embodiment of FIG. 7, the present embodiment has the structure in which the first organic layer 223a extends over a second region 32.

The third organic layer 223c may include a particular dopant material so that metal, in particular, Mg or an Mg alloy for forming the second electrode 222, may be easily deposited thereon. The particular dopant material may include Di-tungsten tetra(hexahydropyrimidopyrimidine) or the like. The first organic layer 223a includes a material on which metal, in particular, Mg or an Mg alloy for forming the second electrode 222, is barely deposited. In more detail, the first organic layer 223a may include N,N-diphenyl-N,N-bis(9-phenyl-9H-carbazol-3-yl)biphenyl-4,4'-diamine (HT01), N(diphenyl-4-yl) 9,9-dimethyl-N-(4(9-phenyl-9H-carbazol-3-yl)phenyl)-9H-fluorene-2-amine (HT211), or the like.

The present embodiment of FIG. 8 uses a characteristic in which, when the second electrode 222 is deposited to a thickness of several hundreds of Angstroms, metal including Mg or an Mg alloy for forming the second electrode 222 forms a layer on the third organic layer 223c including the particular dopant material, but does not adhere to first organic layer 223a and the second organic layer 223b. The third organic layer 223c including the particular dopant material is formed in a region whereon the second electrode 222 is to be formed, and the first organic layer 223a is formed on a portion of the second region 32 in which the second electrode 222 should not be formed. By doing so, when the second electrode 222 is deposited by using metal including Mg or an Mg alloy. Although deposition is performed on all pixels in the first region 31 and the second region 32 by using the metal and an open mask, the metal is only deposited on the third organic layer 223c including the particular dopant material, and the metal is barely deposited on an exposed surface of the first organic layer 223a, so that a patterning effect with respect to the second electrode 222 is automatically obtained.

Meanwhile, whether to deposit a material for the second electrode 222 is relative. In the embodiment of FIG. 8, the material for the second electrode 222 is relatively further deposited on the third organic layer 223c including the particular dopant material, compared to the first organic layer 223a, and in the embodiment of FIGS. 4 through 7, the material for the second electrode 222 is relatively further deposited on the first auxiliary layer 230, compared to the first and third organic layers 223a and 223c, and the second auxiliary layer 235.

Figure 9:
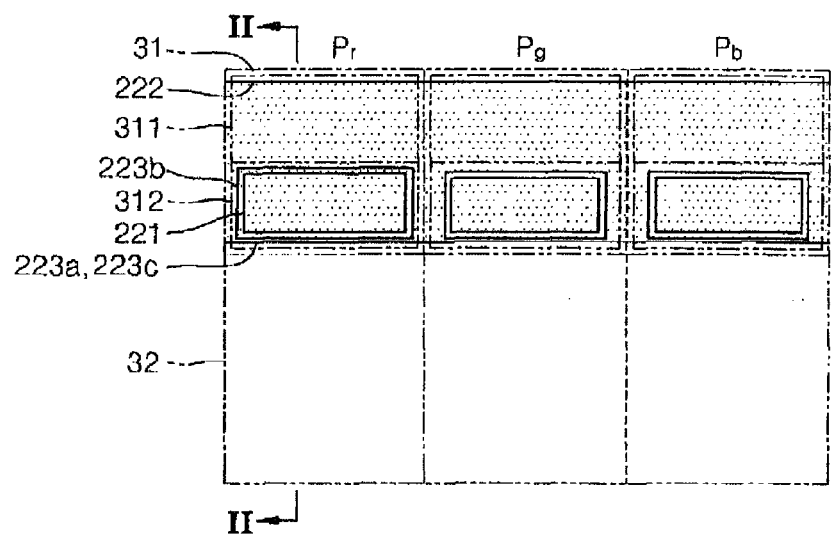
FIG. 9 is a cross-sectional view for describing in detail another example of the organic EL of FIG. 4 according to another embodiment of the present invention.

Thus, in the embodiment of FIG. 4, when the metal to form the second electrode 222 is deposited by using the open mask, as illustrated in FIG. 9, a first portion 222a of the second electrode 222 which has a first thickness t1 may be formed on the first portion 230a of the first auxiliary layer 230, and a second portion 222b of the second electrode 222 which has a second thickness t2 may be formed on the second auxiliary layer 235 of the second region 32. The second thickness t2 is less than the first thickness t1, so that transmittance deterioration due to the second portion 222b may be decreased.

Here, a range of the first thickness t1 may be from about 500 Å to about 1000 Å. However, the range of the first thickness t1 may vary according to a size of a device. For example, in a small device, the range of the first thickness t1 may vary within several hundreds of Å, and in a large device, the range of the first thickness t1 may vary within several thousands of Å. Meanwhile, when it is assumed that transmittance of the device before the second electrode 222 is deposited on a second portion 32 is 100%, a range of the second thickness t2 may be set so that the transmittance of the device after the second electrode 222 is deposited on the second portion 32 may be equal to or greater than 70%.

Although it is not illustrated, in the embodiment of FIG. 5, the second electrode 222 having a smaller thickness may be formed on the second auxiliary layer 235 of the second region 32, as in FIG. 9. Also, in the embodiment of FIG. 6, the second electrode 222 having a smaller thickness may be formed on the third organic layer 223c of the second region 32, as in FIG. 9.

Figure 10:
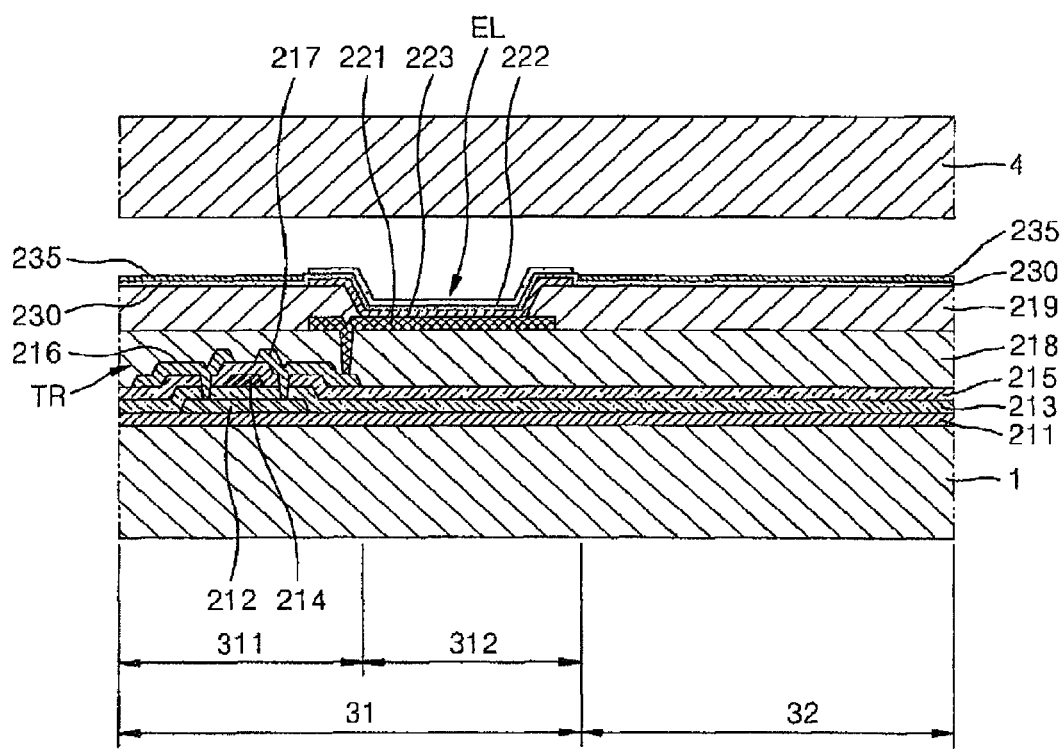
FIG. 10 is a cross-sectional view for describing in detail another example of the organic EL of FIG. 8 according to another embodiment of the present invention.

Also, in the embodiments of FIGS. 7 and 8, the second electrode 222 having a smaller thickness may be formed on the first organic layer 223a of the second region 32, as in FIG. 10.

Figure 11:
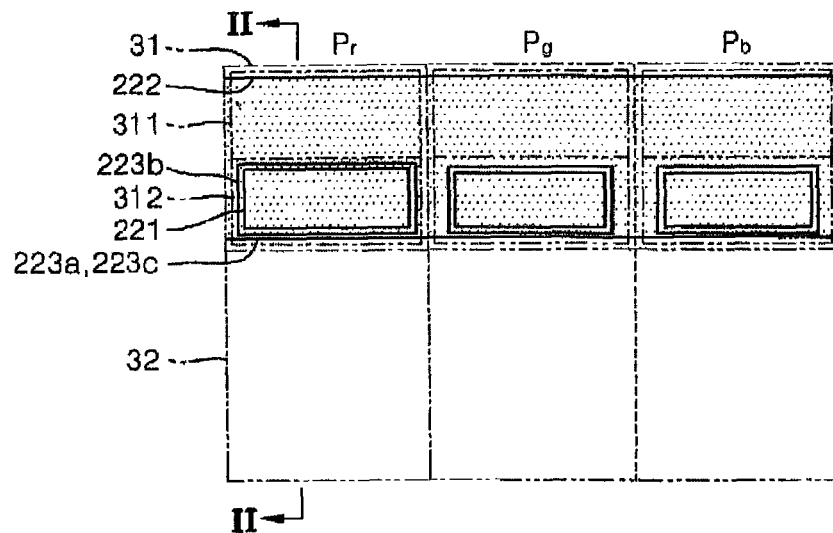
FIG. 11 is a plane view of a red pixel, a green pixel, and a blue pixel which are adjacent to each other in an organic light emitting display device according to another embodiment of the present invention.
Figure 12:
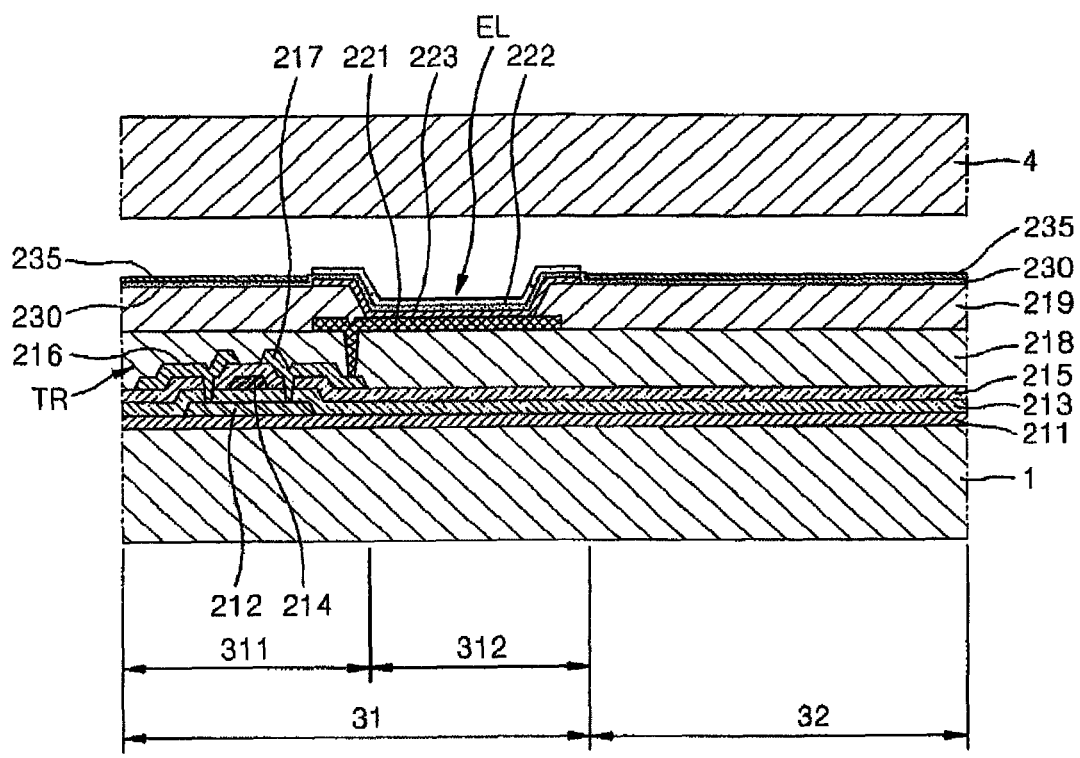
FIG. 12 is a cross-sectional view of the red pixel, taken along a line II-II of FIG. 9.

The one or more embodiments of the present invention are not only applied to structures of FIGS. 2 and 3 in which the first electrode 221 overlaps the pixel circuit unit including the thin film transistor TR, but can also be applied to the structures illustrated in FIGS. 11 and 12 where the light emitting diode is not arranged over the pixel circuit unit.

Unlike the structure of FIG. 3, in the structure of FIG. 12, the second auxiliary layer 235 is also formed within circuit part 311 of first region 31 as well as in the second region 32. By doing so, a second electrode 222 is formed only on a portion corresponding to an emission part 312 of first region. Except for this feature, configuring elements and their functions are the same as those described with reference to FIG. 3, and thus, detailed descriptions thereof are omitted here.

According to the one or more embodiments of the present invention, transmittance deterioration in an area for transmitting external light may be minimized, so that a user may easily view an external image through the display.

Also, the second electrode is formed without using a fine metal mask, so that distortion in a position and a shape of a transmittance portion, which occurs by using the fine metal mask, may be overcome. Most of all, the second electrode may be effectively patterned so that a manufacturing process may be significantly improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device, the organic light emitting display device has at least one first region that emits light, and at least one second region that transmits external light, the organic light emitting display device comprising:
   a substrate; and
   a plurality of pixels arranged on the substrate, at least one pixel including:
      a first electrode in the at least one first region;
      an organic layer disposed on the first electrode, the organic layer comprising an emission layer;
      a first auxiliary layer disposed on the organic layer, the first auxiliary layer comprising a first portion that is disposed in the at least one first region;
      a second auxiliary layer being adjacent to the first auxiliary layer, the second auxiliary layer being disposed in the at least one second region; and
      a second electrode disposed on the first auxiliary layer in the at least one first region,
   wherein at least a portion of the second electrode is directly contacted with the first auxiliary layer.

2. The organic light emitting display device of claim 1, the at least one pixel further comprising:
   a pixel circuit unit that includes at least one thin film transistor that is electrically connected to the first electrode.

3. The organic light emitting display device of claim 2, wherein at least a portion of the at least one thin film transistor is not overlapped with the first electrode.

4. The organic light emitting display device of claim 2, wherein the first electrode completely covers the at least one thin film transistor in a plan view.

5. The organic light emitting display device of claim 1, the first auxiliary layer further comprising a second portion that is extended from the first portion, the second portion being disposed in the at least one second region.

6. The organic light emitting display device of claim 5, wherein the second auxiliary layer is disposed on the first auxiliary layer in the at least one second region, and the second auxiliary layer and the second portion of first auxiliary layer are overlapped with each other in a plan view.

7. The organic light emitting display device of claim 5, wherein the organic layer further comprises a first organic layer disposed between the first electrode and the emission layer, and a second organic layer disposed between the emission layer and the first auxiliary layer, and the first organic layer, emission layer and the second organic layer are disposed in the at least one first region.

8. The organic light emitting display device of claim 7, wherein the first organic layer is further disposed in the at least one second region.

9. The organic light emitting display device of claim 8, wherein the first organic layer is directly contacted with the first auxiliary layer in the at least one second region.

10. The organic light emitting display device of claim 7, wherein the second organic layer is further disposed in the at least one second region.

11. The organic light emitting display device of claim 1, wherein the second electrode is further disposed on the second auxiliary layer, a thickness of the second electrode in the at least one first region is thicker than a thickness of the second electrode in the at least one second region.

12. The organic light emitting display device of claim 1, wherein the organic layer further comprises a first organic layer disposed between the first electrode and the emission layer, and a second organic layer disposed between the emission layer and the first auxiliary layer.

13. The organic light emitting display device of claim 12, wherein the first organic layer, emission layer and the second organic layer are disposed in the at least one first region.

14. The organic light emitting display device of claim 13, wherein the first organic layer is further disposed in the at least one second region.

15. The organic light emitting display device of claim 13, wherein the second organic layer is further disposed in the at least one second region.

16. An organic light emitting display device, the organic light emitting display device has at least one first region that emits light, and at least one second region that transmits external light, the organic light emitting display device comprising:
   a substrate; and
   a plurality of pixels arranged on the substrate, at least one pixel including:
      a first electrode in the at least one first region;
      a pixel circuit unit that includes at least one thin film transistor that is electrically connected to the first electrode;
      an organic layer disposed on the first electrode, the organic layer comprising an emission layer;
      a first auxiliary layer disposed on the organic layer, the first auxiliary layer comprising a first portion that is disposed in the at least one first region and a second portion that is disposed in the at least one second region;
      a second auxiliary layer disposed on the first auxiliary layer, the second auxiliary layer being disposed in the at least one second region; and
      a second electrode disposed on the first auxiliary layer in the at least one first region,
   wherein at least a portion of the second electrode is directly contacted with the first auxiliary layer.

17. The organic light emitting display device of claim 16, wherein the second electrode is further disposed on the second auxiliary layer, a thickness of the second electrode in the at least one first region is thicker than a thickness of the second electrode in the at least one second region.

18. The organic light emitting display device of claim 16, wherein the first and the second auxiliary layers being transparent to visible light.

19. The organic light emitting display device of claim 16, wherein the first auxiliary layer comprises a material that has better adhesion to the second electrode than the second auxiliary layer.

20. The organic light emitting display device of claim 16, wherein the second electrode comprises magnesium (Mg).

* * * * *